United States Patent [19]

Dyer

[11] Patent Number: 4,947,360

[45] Date of Patent: Aug. 7, 1990

[54] LOW FREQUENCY DIGITAL NOTCH FILTER

[75] Inventor: Nigel P. Dyer, Chiswick, England

[73] Assignee: Plessey Overseas Limited, Ilford Essex, United Kingdom

[21] Appl. No.: 895,020

[22] Filed: Aug. 8, 1986

[30] Foreign Application Priority Data

Aug. 28, 1985 [GB] United Kingdom ............... 8521378

[51] Int. Cl.$^5$ ........................................... G06F 15/31
[52] U.S. Cl. ........................................... 364/724.07
[58] Field of Search ............... 364/724, 724.01, 724.07

[56] References Cited

U.S. PATENT DOCUMENTS

| | | | |
|---|---|---|---|
| 3,967,102 | 6/1976 | McCown | 364/724 |
| 4,215,415 | 7/1980 | Kamemasa et al. | 364/724 |
| 4,524,422 | 6/1985 | Kasuga | 364/72 X |

OTHER PUBLICATIONS

Abu-El-Haija et al., "A Structure for Digital Notch Filters", IEEE Trans. on Acoustics, Speech and Signal Proc., vol. ASSP-27 HZ, pp. 193-195, Apr. 1979.
IEEE Proceeding, vol. 130, Pt. G., No. 6, Dec. 1983, Valenzuela et al., pp. 225-234—"Digital Signal . . . Decimation".
IEEE Transactions on Acoustics, Speech and Signal Processing, vol. ASSP-22, No. 1, Feb. 1974, pp. 10-15, N.Y., U.S.; J. A. Cadzow: "Digital Notch . . . Procedure" etc.
1982 International Symposium on Circuits and Systems, Rome, May 10th-12th, 1982, vol. 2, pp. 260-263, IEEE; AG Constantinides et al: "A Class of Efficient . . . Transmultiplexing" etc.
IEEE Transactions on Communications, vol. COM-22, No. 7, Jul. 1974, pp. 964-970, New York, U.S.; K. Hirano et al: "Design of Digital . . . " . . . etc.

*Primary Examiner*—Gary V. Harkcom
*Assistant Examiner*—Dale M. Shaw
*Attorney, Agent, or Firm*—Fleit, Jacobson, Cohn, Price, Holman & Stern

[57] ABSTRACT

A low frequency digital notch filter comprising two sub-filters - an all-pass-network filter (1) and a T-section filter (3) with a feedback connection from the T-filter to an input node (31), and feed forward connection from this input node to a terminal output node (33). The all-pass-network filter (1) has a transform function:

$$A(Z) = [Z^{-1} + K]/[1 + K_1 Z^{-1}]; \text{ and}$$

the T-section filter (3) has throughput and tap transform functions:

$$B(Z) = [(K_3 + K_2 \cdot K_4) Z^{-1} - 1]/[1 - K_3 Z^{-1}],$$

and, $$C(Z) = K_2 Z^{-1}/[1 - K_3 Z^{-1}],$$

where $Z^{-1}$ is the unit delay operator and $K_1$ to $K_4$ are multiplier coefficients. The T-section filter 3 may be implemented using a combination of three multipliers (19, 21 and 23) and a delay element (25).

8 Claims, 2 Drawing Sheets

LOW FREQUENCY DIGITAL NOTCH FILTER

TECHNICAL FIELD

The present invention concerns improvements in or relating to the design of low frequency digital notch filters and, composite filters incorporating the same.

There are many Digital Signal Processing (DSP) applications where one of the functions required is a filter to reject any low frequency signals, and possibly in addition, to reject any DC component of the signal. A typical application of such a filter arises where the digital signal being processed is a digital representation of an analogue signal where the analogue signal contains unwanted signals at 50 Hz or 60 Hz. These signals can arise as signals coupled into the system from nearby line powered equipment. It is often necessary to remove these unwanted signals together with any DC component that is present.

BACKGROUND ART

A number of different filter structures have hitherto been considered for implementing such a filter, particularly for applications where the frequencies of signals that are to be rejected are but a small fraction of the system sampling rate (approx. 1%). When considering the suitability of such structures, a number of aspects of their performance must be considered. To ensure easy and efficient implementation, it is desirable that the filter should have a reasonably regular structure. Also, considering cost factors, it should have a minimum of complexity. It is also a requisite that the member of multiplications be kept to a minimum and it is preferable that the wordlength of multiplier coefficients also be kept to a minimum. There are other performance considerations that lead to a need for increased signal wordlength. Recursive filter structures tend to amplify any quantisation noise which must inveriably occur during the truncation operation that follows any multiplier stage. It is usual to compensate for this amplification by adopting additional bits in the signal wordlength in order to keep filter noise at an acceptable level. The signal amplitudes at internal nodes of the filter must also be considered. A filter with a high effective Q-factor may have signals at internal nodes as much as 40 dB higher in amplitude than the input signal, at certain frequencies, even if the overall gain is unity. Clipping is prevented again by increasing signal wordlength.

By way of example, consider an application requiring the rejection of signals at 50 Hz and 60 Hz by at least 25 dB, rejection of all components at DC, with less than 0.7 dB attenuation of signals or 200 Hz at a system sampling rate of 8 Hz.

A filter comprised of biquadratic sections would be very regular and easy to implement. However, such a filter optimised for best noise and signal growth performance, would include as many as fourteen 9-bit multipliers and six delay elements. This would have a noise amplification of approx. 13 dB with noise gain at internal nodes of 0 dB. The signal wordlength would need to be increased by an additional three bits for filter compensation as aforesaid. It should however be noted that many alternative structures exist. Thus for example, a filter with considerably worse signal growth performance could be implemented using eleven multipliers and five delay elements.

DISCLOSURE OF THE INVENTION

It is intended to provide a digital filter of reasonably regular structure, but one with less complexity for equivalent or better performance than that provided hitherto.

In accordance with the invention there is provided a low frequency digital notch filter comprising
an input node;
an all-pass-network filter, connected to this node, including at least one delay element and at least one coefficient multiplier for multiplication by a coefficient $K_1$, the transform function A(Z) of this filter being given by the expression:

$$A(Z)=[Z^{-1}+K_1]/[1+K_1Z^{-1}],$$

where the term $Z^{-1}$ used in this expression is the unit delay operator; a T-section filter, connected at input to the output of the all-pass-network filter and connected at T-output by a negative feedback connection to the input node, this latter filter including at least one delay element and at least three coefficient multipliers for multiplication by coefficients $K_2$, $K_3$ and $K_4$ respectively, the throughput transform function B(Z) of this filter being given by the expression:

$$B(Z)=[1+(K_2.K_4-K_3)Z^{-1}]/[1-K_3Z^{-1}],$$

and, the input-to-T transform function C(Z) of this filter being given by the expression:

$$C(Z)=K_2Z^{-1}/(1-K_3Z^{-1});$$

and, a terminal output node connected to the output of the T-section recursive filter and to the input node.

The notch filter aforesaid may be combined in series with a DC-rejection filter, according to application.

BRIEF INTRODUCTION TO THE DRAWINGS

In the drawings accompanying this application

DESCRIPTION OF A PREFERRED EMBODIMENT

An embodiment of the invention will now be described, by way of example only, with particular reference to the drawings aforesaid.

Figure 1:
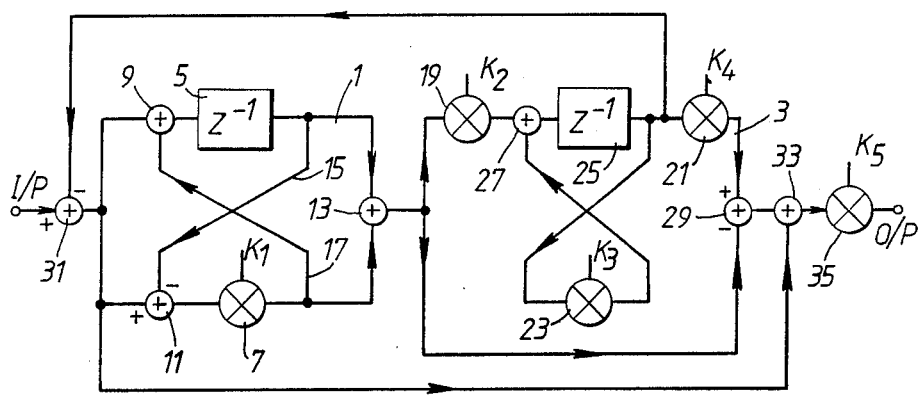
FIG. 1 is a circuit diagram of a low frequency digital notch filter implemented in accordance with the invention.

The low frequency notch filter section of a composite rejection filter is shown in FIG. 1. Essentially, this section is comprised of two sub-filters, an all-pass-network filter 1 and a T-section filter 3.

The all-pass-network filter 1 incorporates a delay element 5 and a coefficient multiplier 7. The transform function of this filter 1 has the form A(Z) given by the expression:

$$A(Z)=(Z^{-1}+K_1)/(1+K_1Z^{-1}),$$

where K is the value of coefficient applied to the multiplier 7. It may be implemented by a standard recursive structure - See, for example, structures described in the article "Digital Signal Processing Schemes for Efficient Interpolation and Decimation" by RIA. Valerzuela and A. G. Constantinides, IEE Proc., Vol.130 Pt.G No.6 (Dec.1983) p.232. The all-pass-network filter 1, shown, includes branch nodes 9 and 11 between a common input, the delay element 5 and the multiplier 7. It also includes an output node 13 which is connected to the output of the delay element 5, and the output of the multiplier 7. Cross-connections 15 and 17 respectively, are provided between the output of the delay element 5 and the input of the multiplier 7 via branch node 11, and between the output of the multiplier 7 and the input of the delay element 5, via the branch node 9.

The T-section filter 3 is connected to the output node 13 of the all-pass-network filter 1. It is comprised of three multipliers 19, 21 and 23 which provide multiplication by coefficients $K_2$, $K_3$ and $K_4$ respectively. The transform functions B(Z) and C(Z) of this filter 3 have the form given in the following expressions:

$$B(Z)=[1+(K_2.K_4=K_3)Z^{-1}]/[1-K^3Z^{-1}];$$

and, (input-to-output.)

$$C(Z)=K_2Z^{-1}/[1-K_3Z^{-1}].$$

(input-to-tap.)

In the implementation of this filter 3, as shown in FIG. 1, the multiplier 19, a branch node 27, the delay unit 25 and the multiplier 21 are connected in series and the delay unit 25 is shunted by the multiplier 23, via the branch node 27. The output of the multiplier 21 is connected to an output node 29. This latter node 29 is also connected to the T-filter input for subtracting input signal.

The low frequency notch filter section is completed by an input node 31 and a terminal output node 33. A feedback signal is extracted from the T-section filter 3 from a point in the signal path between the delay unit 25 and the multiplier 21, and subtracted from the input signal at the input node 31. The output signal from the node 31 is fed in parallel to the input of the all-pass-network filter 3 and to the output node 33, where it summed with the output signal of the T-section filter 3.

The low frequency notch filter section shown in FIG. 1 also includes a fifth multiplier 35 which is connected to the output of the output node 33. This latter introduces further multiplication by a coefficient $K_5$, of value ½.

Figure 2:
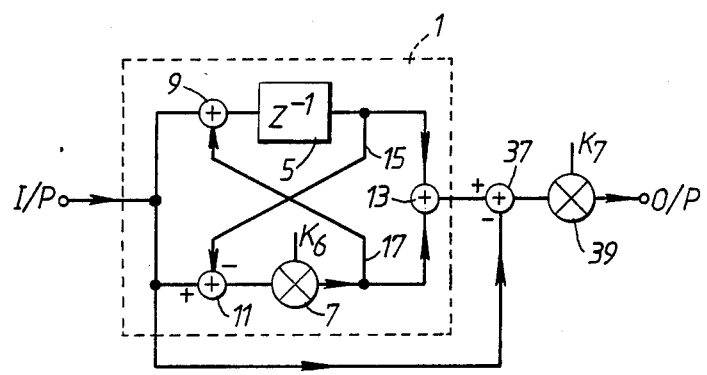
FIG. 2 is a circuit diagram of a DC-rejection filter for use in combination with the notch filter shown in the preceding figure and, FIG. 3 is a graph showing a typical gain frequency response specification, and a frequency response attainable using a combination of the filters shown in the preceding figures.

The DC-rejection filter section of the composite filter is shown in FIG. 2. This latter section is connected in series with the low frequency notch filter section described above. Essentially this section is comprised of an all-pass-network filter 1 and an output node 37. The input signal to this section is fed in parallel to the network filter 1 and to the output node 37. At this node 37 the input signal is subtracted from signal from the output of the network filter 1. The all-pass-network filter 1 may be of identical configuration to that previously described with reference to FIG. 1. The multiplier 7 in this case provides multiplication by a coefficient $K_6$. In the DC-rejection filter shown in FIG. 2, the output node 37 is connected to a seventh multiplier 39. This multiplier 39 introduces further multiplication by a coefficient $K_7$ of value ½. This choice of DC-rejection filter offers improvement performance compared with its biquadratic section counterpart, and is very similar in form to the notch filter, thus improving the potential for efficient implementation.

Figure 3:
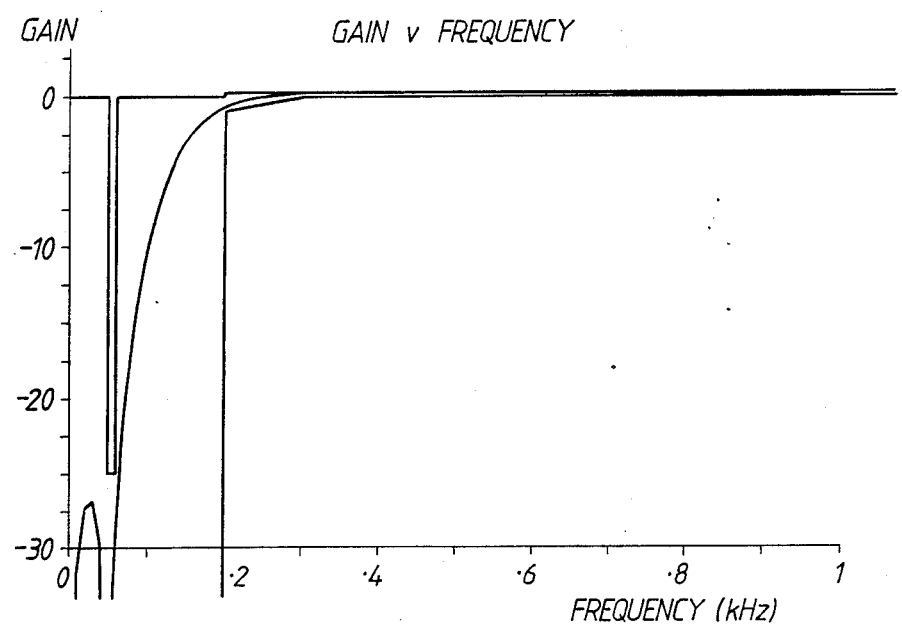

A typical performance specification is illustrated in FIG. 3. Rejection at 50 Hz is required and a level response for frequencies above 200 Hz. Suitable values for the coefficients $K_1$ to $K_7$ are given in Table 1 appearing below:

TABLE 1

| Coefficient | Value |
|---|---|
| $K_1$ | −[1-3/16] |
| $K_2$ | 1/16 |
| $K_3$ | 1-1/128 |
| $K_4$ | ½ |
| $K_5$ | ½ |
| $K_6$ | −[1-1/32] |
| $K_7$ | ½ |

As can be seen from FIG. 3, the required performance is readily achieved when the coefficients given above are adopted. The figure shows DC-rejection, low frequency rejection at 50 Hz, and, a near level response at frequencies above 200 Hz.

The following table gives the performance of the two sections, FIGS. 1 and 2, taken together.

TABLE 2

Structure: Reasonably regular, uses simple all-pass-network as the basic building block for the filter.

Complexity: 7 multipliers, 3 delay elements.

Multipliers: 7 bit, although 4 of the 7 multipliers, being simply a division by a power of two can be very simply implemented.

Noise amplification: approx. 10 dB.

Maximum noise gain at internal nodes: 3 dB.

Signal wordlength: 3 additional bits required to compensate for filter.

It can be seen that this structure offers a number of improvements over more conventional structures, at the expense of a slightly less regular structure. It manages to achieve similar performance to the biquadratic section filter examined earlier for a given signal wordlength using half the number of storage elements and half the number of multipliers, and with the multiplications in many cases being trivial, e.g. ½ etc.

The coefficients $K_1$ to $K_7$ may be varied to meet the requirements of other applications, in particular to vary the frequency of the notch filter relative to the sampling frequency. One of the advantages of the structure aforesaid is that many of the multiplications may be performed trivially i.e. using divide-by-two cascades, even when the coefficients are altered to conform to a different requirement. Thus referring to FIGS. 1 and 2, the coefficients $K_5$ and $K_7$ would always be chosen equal to ½. It can usually be arranged for one if not both of the coefficients $K_2$ and $K_4$ to be a power of ½ and the coefficient $K_3$ to be related to the coefficients $K_2$ and $K_4$ as follows: $K_3=1-(2 * K_2 * K_4)$.

What is claimed is:

1. A low frequency digital notch filter comprising:
an input node;
an all-pass network first filter stage having an input and an output, said input being connected to said input node, the first filter stage including at least one first delay element and at least one first coefficient multiplier for multiplication by a coefficient K1, the first delay element and first coefficient multiplier being interconnected is such a way as to provide a transfer function A(z) for the first stage as follows:

$$A(z) = (z^{-n} + K_1)/(1 + K_1 z^{-n}), \text{ where } n \leq 1;$$

a second filter stage having an input and an output, the input of the second filter stage being coupled to the output of the first filter stage, the second filter stage including a second delay element and three second coefficient multipliers for multiplication by coefficients $K_2$, $K_3$ and $K_4$ respectively, the second delay element and second multipliers being so interconnected that the transfer function B(z) for the second stage is as follows:

$$B(z) = [(K_3 + K_2 . K_4 (z^{-n} - 1]/(1 - K_3 z^{-n}), \text{ where } n \leq 1;$$

a filter output node coupled to the output of the second filter stage; and a feedforward line coupled between said input node and said output node for summing the filter input with the output of the second stage, whereby to provide a notch characteristic at a desired frequency.

2. A filter according to claim 1, wherein the second filter stage has a tapping node located at the output of the second delay element, such that the transfer function C(z) between the input to the second stage and the tapping point is given as follows:

$$C(z) = K_2 z^{-n}/(1 - K_3 z^{-n}), \text{ where } n \geq 1;$$

and a feedback line coupled between said tapping point and said input node.

3. A notch filter, as claimed in claim 1 wherein the T-section filter comprises three multipliers and a delay element, two of these multipliers being connected one each side of the delay element, and the remaining one shunted across the delay element via a branch node, an output node being included to subtract signal introduced at a common input from signal output from the multipliers.

4. A notch filter, as claimed in claim 1 wherein the value of coefficient $K_3$ is related to the coefficients $K_2$ and $K_4$ by the expression:

$K_3 = 1 - (2 * K_2 * K_4)$ and the coefficients $K_2$ and $K_4$ are powers of $\frac{1}{2}$.

5. A notch filter, as claimed in claim 1 and including a fifth multiplier, for multiplication by a coefficient $K_5$ connected to the output node.

6. A composite filter comprising a notch filter, as claimed in claim 1 and DC-rejection filter connected in series therewith.

7. A composite filter, as claimed in claim 6, wherein the DC-rejection filter comprises a common input;

an all-pass-network filter stage of identical construction to said first filter stage; and, a node connected to the common input and the output of the all-pass-network filter to subtract input signal from filter output signal.

8. A composite filter, as claimed in claim 6, wherein a seventh multiplier, a divide-by-two multiplier is included at the output of the DC-rejection filter.

* * * * *